United States Patent
Tanaka

(10) Patent No.: US 8,324,801 B2
(45) Date of Patent: Dec. 4, 2012

(54) ORGANIC ELECTROLUMINESCENCE ELEMENT

(75) Inventor: Shin-ya Tanaka, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 405 days.

(21) Appl. No.: 12/438,377

(22) PCT Filed: Aug. 29, 2007

(86) PCT No.: PCT/JP2007/066792
§ 371 (c)(1),
(2), (4) Date: Feb. 23, 2009

(87) PCT Pub. No.: WO2008/026649
PCT Pub. Date: Mar. 6, 2008

(65) Prior Publication Data
US 2010/0244666 A1 Sep. 30, 2010

(30) Foreign Application Priority Data
Aug. 30, 2006 (JP) .................. 2006-233077

(51) Int. Cl.
*H01L 27/32* (2006.01)
*H01L 51/50* (2006.01)

(52) U.S. Cl. .................. 313/504; 313/498; 313/506

(58) Field of Classification Search ........... 313/498–512
See application file for complete search history.

(56) References Cited

U.S. PATENT DOCUMENTS

| | | | |
|---|---|---|---|
| 6,720,091 B2 * | 4/2004 | Ohnishi et al. | 428/690 |
| 6,900,470 B2 | 5/2005 | Kobayashi et al. | |
| 2002/0158835 A1 * | 10/2002 | Kobayashi et al. | 345/100 |
| 2003/0007113 A1 * | 1/2003 | Yamanaka et al. | 349/113 |
| 2003/0038589 A1 * | 2/2003 | Kim et al. | 313/503 |
| 2005/0116620 A1 * | 6/2005 | Kobayashi | 313/503 |

FOREIGN PATENT DOCUMENTS

| | | |
|---|---|---|
| JP | 08-180974 A | 7/1996 |
| JP | 11-339970 A | 12/1999 |
| JP | 2000-091083 A | 3/2000 |
| JP | 2002-014211 A | 1/2002 |
| JP | 2002-156633 A | 5/2002 |
| JP | 2002-280172 A | 9/2002 |
| JP | 2002-318553 A | 10/2002 |
| JP | 2002-318556 A | 10/2002 |
| JP | 2003-092190 A | 3/2003 |
| JP | 2003-123988 A | 4/2003 |
| JP | 2004-279473 A | 10/2004 |
| JP | 2004-354599 A | 12/2004 |

OTHER PUBLICATIONS

Notice of Reasons for Rejection, mailed Oct. 31, 2011, issued in corresponding Japanese Patent Application No. 2007-191026, along with an English translation thereof.

* cited by examiner

*Primary Examiner* — Joseph L Williams
*Assistant Examiner* — Nathaniel Lee
(74) *Attorney, Agent, or Firm* — Sughrue Mion, PLLC

(57) ABSTRACT

An organic electroluminescence element is provided with a first electrode composed of a transparent electrode or a semi-transparent electrode; a second electrode facing the first electrode; and at least one organic layer arranged between the first electrode and the second electrode. The organic electroluminescence device is further provided with an auxiliary electrode, which is electrically connected to the first electrode, composed of a material having a lower electrical resistance value compared with that of the first electrode and has an opening. The auxiliary electrode is formed on the surface of the first electrode to have an area fixed based on a lattice point specified by a quasi-periodic two-dimensional arrangement as the opening section.

35 Claims, 3 Drawing Sheets

A                  B

A  B

A  B

ORGANIC ELECTROLUMINESCENCE ELEMENT

TECHNICAL FIELD

The present invention relates to an organic electroluminescence device useful as a light-emitting device employed in planar light sources, segment display devices, dot-matrix display devices, liquid crystal display devices, and the like.

BACKGROUND ART

It has been studied in recent years to use, in display devices and illuminators, an organic electroluminescence device (hereinafter, sometimes referred to as an organic EL device) having a two-layer structure in which an organic fluorescent dye is employed as a light-emitting layer and the dye and an organic charge transport compound used in electrophotographic photoreceptors and the like are laminated to each other.

However, the display devices and illuminators using the organic EL device or the like each have a problem that as the light-emitting area thereof increases, voltage drop due to the wiring resistance of a transparent electrode or semitransparent electrode becomes not negligible, which increases the variation of light brightness.

For solving these problems, for example, JP-A-2004-14128 (PATENT DOCUMENT 1) discloses a planar light-emitting device using an organic EL device, in which to a transparent electrode of the organic EL device is electrically connected an auxiliary electrode having lower resistance than the transparent electrode; the specification thereof describes a planar light-emitting device in which the auxiliary electrode is formed in a lattice shape.

However, the use of an organic EL device as described in PATENT DOCUMENT 1 has posed a problem that coloring and Moire fringes due to interference occur during external light reflection, which deteriorates visibility.
PATENT DOCUMENT 1: JP-A-2004-14128

DISCLOSURE OF THE INVENTION

Problems to be Solved by the Invention

Made in view of the problems of the prior art, the present invention has an object of providing an organic electroluminescence device capable of reducing voltage drop due to the resistance of a transparent electrode or a semitransparent electrode to uniformly emit light and even of sufficiently suppressing the occurrence of coloring and Moire fringes due to interference during external light reflection.

Means for Solving the Problems

As a result of intensive studies for achieving the above object, the present inventor has found that an organic electroluminescence device provided with a first electrode composed of a transparent electrode or a semitransparent electrode, a second electrode facing the first electrode, and at least one organic layer set between the first and second electrodes can reduce voltage drop due to the resistance of the transparent electrode or semitransparent electrode to uniformly emit light and sufficiently suppress the occurrence of coloring and Moire fringes due to interference during external light reflection by the formation, on the surface of the first electrode, of an auxiliary electrode having openings provided based on a specific ordered array having no periodical regularity. Thereby, the present invention is accomplished.

Thus, the organic electroluminescence device of the present invention is an organic electroluminescence device provided with a first electrode composed of a transparent electrode or a semitransparent electrode, a second electrode facing the first electrode, and at least one organic layer set between the first and second electrodes, characterized in that:

the organic electroluminescence device comprises an auxiliary electrode provided with openings, which is electrically connected to the first electrode and composed of a material having a lower electrical resistance value than that of the first electrode; and the auxiliary electrode is formed on the surface of the first electrode so as to have the regions defined based on lattice points determined by a quasi-periodic two-dimensional array as the openings.

In the organic electroluminescence device of the present invention, the auxiliary electrode may also be formed on Voronoi edges of Voronoi tessellation using the lattice points as generating points so that the Voronoi regions of the Voronoi tessellation are the openings.

In addition, in the organic electroluminescence device of the present invention, the auxiliary electrode may also be formed on Delaunay edges of Delaunay triangulation using the lattice points as generating points so that the Delaunay triangular regions of the Delaunay triangulation are the openings.

In the organic electroluminescence device of the present invention, it is preferred that the quasi-periodic two-dimensional array is arranged analogously or similarly to a Fibonacci sequence, i.e., an array using the Fibonacci array.

In addition, in the organic electroluminescence device of the present invention, it is preferred that the quasi-periodic two-dimensional array has unit arrays extracted from a Fibonacci array so that the lattice points have a mean distance between lattices ranging from 10 to 30 µm, and is an array in which the unit arrays are spread all over so that they do not ride over each other.

In the organic electroluminescence device of the present invention, the unit arrays are preferably arrays extracted from the Fibonacci array so that the order in the Fibonacci sequence ranges from 300 to 1,000.

Further, in the organic electroluminescence device of the present invention, the auxiliary electrode is preferably located on a side opposite to the organic layer of surfaces of the first electrode.

In the organic electroluminescence device of the present invention, it is preferred that the first electrode is partitioned into a plurality of electrically separated cells and the plurality of cells are electrically connected to each other by the auxiliary electrode.

The planar light source of the present invention is characterized by comprising the organic electroluminescence device. The segment display device of the present invention is also characterized by comprising the organic electroluminescence device. In addition, the dot-matrix display device of the present invention is characterized by comprising the organic electroluminescence device. The liquid crystal display device of the present invention is also characterized by comprising the organic electroluminescence device.

The organic electroluminescence device of the present invention can reduce voltage drop due to the resistance of a transparent electrode or a semitransparent electrode to uniformly emit light and can sufficiently suppress the occurrence of coloring and Moire fringes due to interference during external light reflection. Specifically, in the organic electroluminescence device of the present invention, a first electrode composed of a transparent electrode or a semitransparent electrode has an auxiliary electrode electrically connected to the first electrode formed on the surface thereof. The auxiliary electrode is composed of a material having a lower electrical resistance value (a higher electric conductivity) than that of the first electrode; therefore, the present invention can reduce voltage drop due to the resistance of the first electrode.

A material blocking light such as metal is typically used as the auxiliary electrode. Thus, the light emitted from the organic layer is blocked by the auxiliary electrode, which results in the taking of the light out of the openings provided on the auxiliary electrode. When an auxiliary electrode having periodic openings provided on the surface of the first electrode is formed as is the case with the auxiliary electrode being formed in a lattice shape, a stripe shape, or the like, coloring and Moire fringes due to interference during external light reflection occur owing to the periodic regularity. In contrast, according to the present invention, the auxiliary electrode is formed so as to have the regions defined based on the lattice points determined by a quasi-periodic two-dimensional array as the openings, and an auxiliary electrode having openings provided based on a specific ordered array having no periodical regularity is formed on the surface of the first electrode; thus, the occurrence of the coloring and Moire fringes due to interference during external light reflection is sufficiently suppressed.

According to the present invention, because the openings are thus provided based on a specific ordered array, variations of light brightness are also sufficiently reduced which result from the deviation of the density (open area ratio) of the openings set on the auxiliary electrodes, differing from the case where the openings are randomly set. Thus, the organic electroluminescence device of the present invention enables the uniform emission of light.

In addition, according to the present invention, improved light brightness can be obtained by making a structure in which the first electrode is partitioned into a plurality of electrically separated cells with the cells electrically connected to the auxiliary electrode. Specifically, the partitioning of the first electrode into electrically separated cells can reduce the light-emitting component guided in the surface direction of the first electrode and thus can improve the light brightness. Variations of light brightness among the plurality of cells are sufficiently reduced because the cells are electrically connected to each other by the auxiliary electrode.

Advantages of the Invention

According to the present invention, an organic electroluminescence device can be provided which can reduce voltage drop due to the resistance of a transparent electrode or a semitransparent electrode to uniformly emit light and can sufficiently suppress the occurrence of coloring and Moire fringes due to interference during external light reflection.

BEST MODE FOR CARRYING OUT THE INVENTION

The organic electroluminescence device of the present invention is described below in detail in line with a preferred embodiment thereof.

The organic electroluminescence device of the present invention is an organic electroluminescence device provided with a first electrode composed of a transparent electrode or a semitransparent electrode, a second electrode facing the first electrode, and at least one organic layer set between the first and second electrodes, characterized in that:

the organic electroluminescence device comprises an auxiliary electrode provided with openings, which is electrically connected to the first electrode and composed of a material having a lower electrical resistance value than that of the first electrode; and the auxiliary electrode is formed on the surface of the first electrode so as to have the regions defined based on the lattice points determined by a quasi-periodic two-dimensional array as the openings.

(First Electrode)

The first electrode according to the present invention is an electrode composed of a transparent electrode or a semitransparent electrode, and serves as an anode of the organic electroluminescence device of the present invention. As the first electrode, there can be used a metal oxide, metal sulfide or metal thin film which has high electric conductivity; those having high transmittance of light can be suitably employed and may be used by proper selection depending on the organic layer used. Materials used for the first electrode include, for example, indium oxide, zinc oxide, tin oxide, electrically conductive glasses (NESA and the like) composed each of their complex, indium-tin-oxide (ITO), indium-zinc-oxide, or the like, gold, platinum, silver, and copper. Among these, preferred are ITO, indium-zinc-oxide, and tin oxide.

The film thickness of the first electrode may be properly selected in consideration of light transmission and electric conductivity; however, it is, for example, 10 nm to 10 µm, preferably 20 nm to 1 µm, and more preferably 50 nm to 500 nm.

When the first electrode is in the form of a structure in which the electrode is partitioned into a plurality of electrically separated cells, the interval between adjacent cells is 1 to 50 µm, preferably 5 to 30 µm. An interval between adjacent cells of less than the lower limit tends to be incapable of sufficiently reducing the light guided in the surface direction of the first electrode. On the other hand, more than the upper limit tends to reduce the efficiency of light emission because it decreases the actual area of light emission.

In addition, the shape of the plurality of cells thus electrically separated is not particularly limited; examples thereof include a stripe shape, a triangle shape, and rectangle shapes such as a quadrangle shape. The shape of the plurality of cells is preferably a shape similar to the shape of openings on an auxiliary electrode to be described later in view of making surer the electrical connection between adjacent cells. When the first electrode is in the form of a structure in which the electrode is partitioned into a plurality of electrically separated cells, a material for something formed after forming the first electrode (for example, an auxiliary electrode or an organic layer) will be filled between adjacent cells in preparing the organic electroluminescence device of the present invention.

Methods for forming the first electrode described above include a vacuum deposition method, a sputtering method, an ion plating method, and a metallizing method. Methods for partitioning the first electrode into a plurality of electrically separated cells include, for example, a method which involves performing pattern formation by an etching method using a photoresist after forming the first electrode.

As the first electrode, there may be used a transparent conductive film of an organic substance such as polyaniline or its derivative and polythiophene or its derivative. The surface of the first electrode on the side of the organic layer may also be provided with a 1- to 200-nm layer of an electroconductive polymer (e.g., a phthalocyanine derivative or a polythiophenone derivative), an Mo oxide, amorphous carbon, carbon fluoride, a polyamine compound, or the like, or a layer with a mean film thickness of 10 nm or less composed of a metal oxide or fluoride, an organic insulating material, or the like.

(Auxiliary Electrode)

The organic electroluminescence device of the present invention needs to comprise an auxiliary electrode which is electrically connected to the first electrode and provided with openings. The auxiliary electrode needs to be formed on the surface of the first electrode so as to have the regions defined based on the lattice points determined by a quasi-periodic two-dimensional array as the openings. According to the present invention, the auxiliary electrode can be provided to reduce voltage drop due to the resistance of a transparent electrode or a semitransparent electrode to uniformly emit light and further to sufficiently suppress the occurrence of coloring and Moire fringes due to interference during external light reflection.

The quasi-periodic two-dimensional array according to the present invention refers to a different type of ordered array from a periodic array; examples thereof include the Fibonacci array. The Fibonacci array refers to an array arranged analogously or similarly to the Fibonacci sequence, and also means a nearly spiral array as shown in FIG. 1, which is compared to the sequence found in sunflower seeds or pine cones or the like. According to the present invention, the lattice points determined by the Fibonacci array include the lattice points of the array based on the Fibonacci sequence, from which some points are removed.

The Fibonacci array refers to the sequence represented by:

$$(x,y)=(\sqrt{n}\times\cos((137.5\times n\pi)/180),$$

$$\sqrt{n}\times\sin((137.5\times n\pi)/180))$$

for an integer n, and the integer n is called the order of the Fibonacci sequence.

In the Fibonacci sequence, as the order of the sequence increases, the variability of density of the lattice points determined by the Fibonacci sequence increases. This can pose a problem that the variability of density of intervals between the openings provided on the auxiliary electrode also increases, which raises the wiring resistance of the auxiliary electrodes.

According to the present invention, in view of the above, it is preferred that the quasi-periodic two-dimensional array according to the present invention has unit arrays extracted from the Fibonacci array so that the lattice points have a mean distance between lattices ranging from 10 to 30 μm (more preferably 10 to 20 μm) and is an array in which the unit arrays are spread all over so that they do not ride over each other. The openings of the auxiliary electrode can be provided on the regions defined based on the lattice points determined by the quasi-periodic two-dimensional array to eliminate periodic regularity in the arrangement of the openings provided on the auxiliary electrode while suppressing an increase in the wiring resistance of the auxiliary electrodes. A mean distance between the lattice points of less than the lower limit tends not to provide sufficient light brightness because of reducing the open area ratio. On the other hand, more than the upper limit tends to be incapable of sufficiently reducing variations of light brightness because of increasing the wiring resistance of the auxiliary electrodes. The distance between the most adjacent lattice points among the lattice points determined by the Fibonacci array, i.e., the nearest-neighbor distance between the lattices, preferably ranges from 5 to 15 μm.

The shape of the unit arrays extracted from the Fibonacci array is not particularly limited; however, it is preferably a polygonal shape, more preferably a triangular shape, square, rectangular or regular hexagonal shape or the like in view of spreading the unit arrays all over so that they do not ride over each other (see FIGS. 2 to 4). In FIGS. 2 to 4, A represents a region having an order of the Fibonacci sequence of 300 or less, and B represents a region having an order of the Fibonacci sequence of 1,000 or less.

In addition, the unit arrays are preferably arrays extracted from the Fibonacci array so that the order of the Fibonacci sequence ranges from 300 to 1,000 (more preferably from 500 to 800). The above range of the order of the Fibonacci sequence can suppress the dispersion of distance between the lattice points determined by one unit array and can make surer of the reduction of variations of light brightness due to scatter in the wiring resistance between the auxiliary electrodes and deviation in the density of openings (open area ratio).

The unit arrays are preferably arrays extracted from the Fibonacci array so that the number of the lattice points determined by one unit array ranges from 50 to 200 (more preferably 50 to 100). In addition, according to the present invention, a plurality of different unit arrays extracted from different sections of the Fibonacci array are preferably spread all over so that they do not ride over each other in view of ensuring the elimination of the periodic regularity of the openings on the auxiliary electrode.

The auxiliary electrode according to the present invention is formed so as to have the regions defined based on the lattice points determined by a quasi-periodic two-dimensional array as described above as the openings. The regions may be defined by the Voronoi tessellation, Delaunay triangulation or the like using the lattice points as generating points.

The Voronoi tessellation refers to tessellating a plane having several points (generating points) positioned into regions (Voronoi regions) formed by connecting perpendicular bisectors drawn between pairs of random adjacent generating points. The boundary line between the Voronoi regions is called the Voronoi edge. When the regions are defined by the Voronoi tessellation, the auxiliary electrode according to the present invention is formed on (along) the Voronoi edges of the Voronoi tessellation using the lattice points as generating points so that the Voronoi regions of the Voronoi tessellation are the openings.

The Delaunay triangulation refers to tessellating a plane having several points (generating points) positioned into triangular regions (Delaunay triangular regions) formed by connecting lines (Delaunay edges) hooking generating points of adjacent Voronoi regions. When the regions are defined by the Delaunay triangulation, the auxiliary electrode according to the present invention is formed on (along) the Delaunay edges of the Delaunay triangulation using the lattice points as generating points so that the Delaunay triangular regions of the Delaunay triangulation are the openings.

The auxiliary electrode preferably has a line width ranging from 1 to 200 μm, more preferably from 10 to 100 μm in view of the use efficiency of light.

The material for the auxiliary electrode is not particularly limited provided that it has higher electric conductivity (a lower electrical resistance value) than the material for the first electrode; however, a conductive material having an electric conductivity of $10^7$ S/cm or more is typically used. Metal materials such as aluminum, silver, chromium, gold, copper, and tantalum are suitably used. Among others, aluminum, chromium, copper, and silver are more preferable in view of high electric conductivity and ease of handling of the material.

The use of a metal as a material for the auxiliary electrode blocks light from an organic layer to be described later; thus, the ratio of the area covered by the auxiliary electrode to the area from which the device emits light preferably ranges from 20 to 90%, more preferably from 30 to 80%.

In addition, the thickness of the auxiliary electrode may be properly selected so that the surface resistance becomes a desired value; however, it is, for example, 10 to 500 nm, preferably 20 to 300 nm, and more preferably 50 to 150 nm.

The auxiliary electrode may be positioned on the side of the organic layer on the surface of the first electrode; however, it is preferably positioned on the surface thereof opposite the organic layer in view of making surer of the electrical connection between the first electrode and the auxiliary electrode.

Methods for forming the auxiliary electrode described above include, for example, a method which involves forming a film of a material for the auxiliary electrode by a vacuum deposition method, a sputtering method, or a lamination method comprising thermocompression-bonding a thin metal film, followed by pattern formation by an etching method employing a photoresist.

(Second Electrode)

The second electrode according to the present invention is an electrode positioned facing the first electrode, and serves as a cathode of the organic electroluminescence device of the present invention. The material used for the second electrode is preferably a material having a small work function; examples thereof used include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium and alloys of two or more thereof; alloys of at least one thereof and one or more of gold, silver, platinum, copper, manganese, titanium, cobalt, nickel, tungsten, and tin; and graphite and intercalated graphite. These alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The film thickness of the second electrode may be properly selected in consideration of electric conductivity and durability; however, it is, for example, 10 nm to 10 µm, preferably 20 nm to 1 µm, and more preferably 50 nm to 500 nm.

Methods for forming the second electrode described above include a vacuum deposition method, a sputtering method, and a lamination method comprising thermocompression-bonding a thin metal film. The second electrode may be in the form of a laminated structure of two layers or more. A layer composed of an electroconductive polymer, or a layer with a mean film thickness of 10 nm or less composed of a metal oxide or fluoride, an organic insulating material, or the like may be provided between the second electrode and the organic layer.

(Organic Layer)

The organic layer according to the present invention is a layer provided between the first electrode and the second electrode.

The organic layer may be a layer containing at least one layer of a light-emitting material, but may also be composed of a plurality of layers. The operation of the organic electroluminescence device consists essentially of the process injecting electrons and holes from the electrodes, the process in which the electrons and holes move through the organic layer, the process in which the electrons and holes are recombined to generate singlet excitons or triplet excitons, and the process in which the excitons emit light. However, when the organic layer is composed of a plurality of layers, a plurality of materials may be allowed to share the function required in each process and may be independently optimized. Emission colors from the organic layer include, for example, intermediate and white colors in addition to the three primary colors of red, blue and green. The three primary emission colors are preferable for full-color elements, and white and intermediate emission colors, for planar light sources.

According to the present invention, not only a low molecular light-emitting material (i) but also a high molecular light-emitting material (ii) may be used as the light-emitting material used for the organic layer. The other materials used for the organic layer vary depending on the type of the light-emitting material; thus, the description thereof will be divided into the case where the low molecular light-emitting material (i) is used and the case where the high molecular light-emitting material (ii) is used.

(i) Use of Low Molecular Light-Emitting Material

In the case of using the low molecular light-emitting material, materials for the organic layer include fluorescence- and phosphorescence-emitting materials, hole-transporting materials, electron-blocking materials, hole-blocking materials, and electron-transporting materials as described in "Yuki EL Display (Organic EL Display)" (Shizuo Tokito, Chihaya Adachi, and Hideyuki Murata, The 1st Edition, 1st Issue issued in 2004, Ohmsha Ltd.) pp. 17-48, 83-99 and 101-120. Specifically, the hole-transporting material is exemplified by those described in JP-A-63-70257, JP-A-63-175860, JP-A-02-135359, JP-A-02-135361, JP-A-02-209988, JP-A-02-311591, JP-A-03-37992, JP-A-03-152184, JP-A-11-35687, JP-A-11-217392, and JP-A-2000-80167.

In addition, examples of the low molecular light-emitting material (triplet emitting complex) include $Ir(ppy)_3$ and $Btp_2Ir(acac)$ containing iridium as a central metal, PtOEP containing platinum as a central metal, and $Eu(TTA)_3phen$ containing europium as a central metal. Specifically, it is exemplified by those described in Nature, (1998), 395: 151, Appl. Phys. Lett. (1999), 75(1): 4, Proc. SPIE-Int. Soc. Opt. Eng. (2001), 4105 (Organic Light-Emitting Materials and Devices IV), 119, J. Am. Chem. Soc., (2001), 123: 4304, Appl. Phys. Lett., (1997), 71(18): 2596, Syn. Met., (1998), 94(1): 103, Syn. Met., (1999), 99(2): 1361, Adv. Mater., (1999), 11(10): 852, and Jpn. J. Appl. Phys., 34: 1883 (1995).

The thickness of layers containing these materials for the organic layer is properly selected so that the efficiency of light emission and drive voltage become desired values; however, it is typically 5 to 200 nm. The hole transport layer has a thickness of, for example, 10 to 100 nm, preferably 20 to 80 nm. The light-emitting layer has a thickness of, for example, 10 to 100 nm, preferably 20 to 80 nm. The hole-blocking layer has a thickness of, for example, 5 to 50 nm, preferably 10 to 30 nm. The electron injection layer has a thickness of, for example, 10 to 100 nm, preferably 20 to 80 nm.

In addition to vacuum processes such as vacuum deposition, cluster deposition, and molecular beam deposition, methods for forming the layers include a method which involves formation into a film using a coating or printing method to be described later if materials constituting these layers have solubility or can form emulsions.

(ii) Use of High Molecular Light-Emitting Material

In the case of using the high molecular light-emitting material, materials for the organic layer include the materials described in "Kobunshi EL Zairyo (High Molecular EL Materials)" (Toshihiro Onishi and Tamami Koyama, The 1st Edition, 1st Issue issued in 2004, Kyoritsu Shuppan Co., Ltd.) pp. 33-58; an organic electroluminescence device can be constructed in a structure in which these materials are each laminated to a charge injection layer and a charge transport layer. More specifically, examples of the hole-transporting, electron-transporting and light-emitting materials of polymer compounds include polyfluorene and derivatives and copolymers thereof, polyarylene and derivatives and copolymers thereof, polyarylenevinylene and derivatives and copolymers thereof, and (co)polymers of an aromatic amine and derivatives thereof disclosed in WO99/13692, WO99/48160, GB2340304A, WO00/53656, WO01/19834, WO00/55927, GB2348316, WO00/46321, WO00/06665, WO99/54943, WO99/54385, U.S. Pat. No. 5,777,070, WO98/06773, WO97/05184, WO00/35987, WO00/53655, WO01/34722, WO99/24526, WO00/22027, WO00/22026, WO98/27136, U.S. Pat. No. 573,636, WO98/21262, U.S. Pat. No. 5,741,921, WO97/09394, WO96/29356, WO96/10617, EP0707020, WO95/07955, JP-A-2001-181618, JP-A-2001-123156, JP-A-2001-3045, JP-A-2000-351967, JP-A-2000-303066, JP-A-2000-299189, JP-A-2000-252065, JP-A-2000-136379, JP-A-2000-104057, JP-A-2000-80167, JP-A-10-324870, JP-A-10-114891, JP-A-09-111233, and JP-A-09-45478. The light-emitting and charge-transporting materials used in the organic layer in the case of using the low molecular light-emitting material described above may be mixed in the high molecular light-emitting and charge-transporting materials. The low molecular light-emitting material described above may also be contained in structures of the high molecular light-emitting and charge-transporting materials.

Specific examples of the charge injection layer include a layer containing an electroconductive polymer, a layer containing a material having an intermediate value of ionization potential between those of a material for the first electrode and a hole-transporting material contained in the hole transport layer, provided between the first electrode and the hole transport layer, and a layer containing a material having an intermediate value of electron affinity between those of a material for the second electrode and an electron-transporting material contained in the electron transport layer, provided between the second electrode and the electron transport layer.

When the charge injection layer is a layer containing an electroconductive polymer, the layer containing an electroconductive polymer is provided adjacent to an electrode between at least one electrode (the first electrode or second electrode) and the light-emitting layer.

The electric conductivity of the electroconductive polymer is preferably $10^{-7}$ S/cm or more and $10^3$ S/cm or less, and is more preferably $10^{-5}$ S/cm or more and $10^2$ S/cm or less, particularly preferably $10^{-5}$ S/cm or more and $10^1$ S/cm or less to reduce the leak current between light-emitting pixels. The electroconductive polymer is usually doped with an appropriate amount of ion in order to make the electric conductivity of the polymer in the range of $10^{-5}$ S/cm or more and $10^3$ S/cm or less.

As the doped ion, there is used an anion in the case of the hole injection layer or a cation in the case of the electron injection layer. Examples of the anion include polystyrene sulfonate ions, alkyl benzene sulfonate ions, and camphorsulfonate ions. Examples of the cation include lithium ion, sodium ion, potassium ion, and tetrabutylammonium ion.

The material used in the charge injection layer may be properly selected in connection with the electrode and a material for the adjacent layer; examples thereof include electroconductive polymers such as polyaniline and its derivatives, polythiophene and its derivatives, polypyrrole and its derivatives, polyphenylene vinylene and its derivatives, polythienylene vinylene and its derivatives, polyquinoline and its derivatives, polyquinoxaline and its derivatives, and polymers containing aromatic amine structures in the main and side chains; metallophthalocyanines (e.g., copper phthalocyanine); and carbon.

An insulating layer having a thickness of 10 nm or less may be provided adjacent to the first electrode and/or the second electrode for the purpose of facilitating the charge injection. Materials for the insulating layer include metal fluorides, metal oxides, and organic insulating materials; preferred are fluorides of alkali metals, alkali earth metals or the like and metal oxides.

The electron-transporting polymer material contained in an organic layer on the side close to the second electrode is not particularly limited provided that it is a polymer material transporting electrons injected from the electrode; π- and σ-conjugated polymers and polymer materials containing electron-transporting groups in the polymers may be used as needed.

In addition, a low-molecular electron-transporting material may also be used therewith.

As the hole-transporting and electron-transporting materials, there may be suitably used those having a mechanism of light emission in addition to charge transport. According to the present invention, these layers may also be used by doping with the light-emitting material.

The thickness of the layers containing the organic layer materials described above shows an optimum value varying depending on the materials to be used; however, it may be properly selected so that the drive voltage and efficiency of light emission become moderate values. The light-emitting layer has a thickness of, for example, 5 to 300 nm, preferably 30 to 200 nm, and more preferably 40 to 150 nm. The charge injection layer has a thickness of, for example, 1 nm to 100 nm, preferably 2 nm to 10 nm. The electron transport layer has a thickness of, for example, 1 nm to 1 μm, preferably 2 nm to 500 nm, and more preferably 5 nm to 200 nm.

Methods for forming a layer (a light-emitting layer, charge transport layer, or charge injection layer) containing the polymer material of the organic layer materials mentioned so far include, for example, a method which involves formation into a film by a method comprising coating or printing from solution. The method may also be adopted as a method for forming a layer (a light-emitting layer, charge transport layer, or charge injection layer) free of the polymer material. The method is very advantageous for production because it only requires drying the solution after application to remove the solvent, and the same procedure may be applied to the case where the charge-transporting material and light-emitting material are mixed. Examples of the coating and printing methods include methods of application such as a spin coat method, a casting method, a microgravure coat method, a gravure coat method, a bar coat method, a roll coat method, a wire bar coat method, a dip coating method, a spray coat method, a screen printing method, a flexographic printing method, an offset printing method, a capillary coating method, a nozzle coating method, and an ink jet printing method. The charge injection material can be formed into a film from that dispersed in emulsion form in water or alcohol by the same method as that for the solution.

In the coating method and printing method, the solvent used for a material for the organic layer is not particularly limited; however, it is preferably a solvent capable of dissolving or uniformly dispersing the polymer material. When the polymer material is a material soluble in a non-polar solvent, examples of the solvent include chlorine solvents such as chloroform, methylene chloride, and dichloroethane; ether solvents such as tetrahydrofuran; aromatic hydrocarbon solvents such as toluene, xylene, tetralin, anisole, n-hexylbenzene, and cyclohexylbenzene; aliphatic hydrocarbon solvents such as decalin and bicyclohexyl; ketone solvents such as acetone, methyl ethyl ketone, and 2-heptanone; and ester solvents such as ethyl acetate, butyl acetate, ethyl cellosolve acetate, and propylene glycol monomethyl ether acetate.

When a plurality of layers are laminated together, an initially formed layer is preferably insolubilized to prevent the mixing of the upper and lower layers. Methods for the insolubilization include a method which involves making insolubilization by using a soluble precursor or a polymer having a soluble group to reduce their solubility by converting the precursor to a conjugated polymer or decomposing the soluble group using heat treatment, a method which involves using a hole-transporting polymer having a crosslinking group in the molecule, and a method which involves blending a monomer or macromer producing a crosslinking reaction after being exposed to heat, light, electron beam, or the like.

A polymer having a vinyl group, a (meth)acrylate group, an oxetane group, a cyclobutadiene group, a diene group, or the like in the side chain as the crosslinking group is mentioned. The introduction ratio of these groups is not particularly limited provided that insolubilization occurs in the solvent used when the electron-transporting polymer is formed into a film; however, it is, for example, 0.01 to 30% by mass, preferably 0.5 to 20% by mass, and more preferably 1 to 10% by mass.

Examples of the monomer and macromer producing a crosslinking reaction include a compound which has a weight average molecular weight in polystyrene equivalent of 2,000 or less and contains at least two of a vinyl group, a (meth)acrylate group, an oxetane group, a cyclobutadiene group, a diene group, and the like. In addition, examples thereof also include an acid anhydride and a compound capable of effecting a crosslinking reaction between the molecules, such as cinnamic acid. As examples thereof, there may be suitably used those described in "UV·EB Kokagijutsu No Genjo To Tembo (UV/EB-curing Technology: present and perspective)" (supervised by Kunihiro Ichimura and issued by CMC Publishing Co., Ltd., 1st Edition, 1st Issue issued in 2002, second chapter).

In addition, when a polymer compound is used as a material for the organic layer, the purity thereof affects the performances of the device such as charge transport and light-emitting characteristics; thus, it is preferred that the monomer is purified before polymerization by a method involving distillation, sublimation purification, recrystallization or the like or column chromatography, and then polymerized. After polymerization, it is preferably subjected to refinement treatment using separation, purification, drying and other conventional operations such as acid washing, alkali washing, neutralization, water washing, organic solvent washing, reprecipitation, centrifugation, extraction, column chromatography, and dialysis.

(Organic Electroluminescence Device)

The organic electroluminescence device of the present invention can be typically prepared by forming the first electrode, second electrode, auxiliary electrode and organic layer described above on a supporting substrate. The supporting substrate may be a substrate which undergoes no change in preparing the organic electroluminescence device; examples thereof include substrates such as glass, plastic, polymer film substrate and silicon substrates. When light from the organic layer is taken out from the side of the supporting substrate, a transparent substrate is preferably used as the supporting substrate. The device structure of the organic electroluminescence device of the present invention is not particularly limited and may be of a top emission type or of a bottom emission type. The order of forming the first electrode and the like on the supporting substrate can be properly selected depending on the device structure. In addition, a protective layer may be optionally provided in the organic electroluminescence device of the present invention. Materials for the protective layer include photo-curable resins such as acrylic resins in addition to glass, plastics, polymer films, and silicon. These protective layer materials may be used alone or in a combination of two or more thereof. When light from the organic layer is taken out from the side of the protective layer, a transparent material is used as the material for the protective layer.

The organic electroluminescence device of the present invention described above can be suitably used as a light-emitting device employed in curved surface-shaped or flat planar light sources for liquid crystal display backlight or illumination; segment display devices employed for interior decoration or advertisement; dot-matrix display devices; liquid crystal display devices; and the like, and can be particularly suitably used in a curved surface-shaped or flat planar light source for illumination.

EXAMPLES

The present invention is more specifically described below with reference to Examples and Comparative Examples. However, the present invention is not intended to be limited to the following Examples. As the compounds A to C represented by the following structural formulas (A) to (C) used in Synthesis Examples 1 and 2, there were employed those synthesized according to the method described in WO2000/046321 published specification.

[Formula 1]

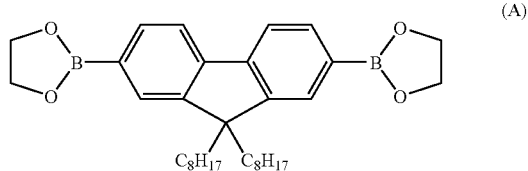

(A)

[Formula 2]

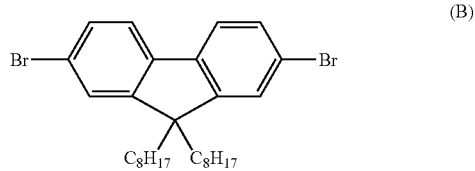

(B)

[Formula 3]

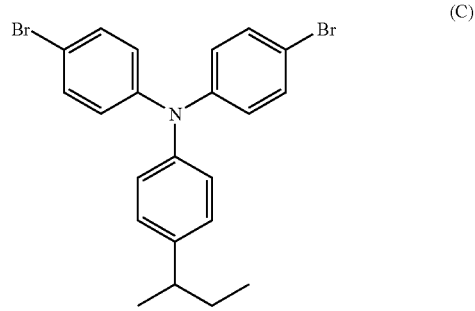

(C)

Synthesis Example 1

First, 0.91 g of methyltrioctylammonium chloride (from Aldrich, trade name: Aliquat 336), 5.23 g of the compound A, and 4.55 g of the compound C were charged in a reaction vessel (200-ml separable flask), followed by purging the reaction system with nitrogen gas. Thereto was added 70 ml of toluene, and 2.0 mg of palladium acetate and 15.1 mg of tris(o-tolyl)phosphine were further added thereto, which was subsequently refluxed to provide a mixed solution.

Next, 19 ml of a sodium carbonate aqueous solution was added dropwise to the resultant mixed solution, which was then stirred under reflux overnight. Thereto was added 0.12 g of phenylboric acid, which was then stirred for 7 hours. Thereafter, 300 ml of toluene was added thereto, and the reaction solution was separated. The organic phase was washed with an acetic acid aqueous solution and water, and a sodium N,N-diethyldithiocarbamate aqueous solution was added thereto, which was then stirred for 4 hours.

Subsequently, the mixed solution after stirring was separated, passed through a silica gel-alumina column, washed with toluene, and added dropwise to methanol to precipitate a polymer. The resultant polymer was filtered, dried under reduced pressure, and then dissolved in toluene. The resultant toluene solution was again added dropwise to methanol to generate a precipitate, which was then filtered and dried under reduced pressure to provide a polymer compound 1. The resultant polymer compound 1 had a weight average molecular weight (Mw) in polystyrene equivalent of $3.2 \times 10^5$ and a number average molecular weight (Mn) in polystyrene equivalent of $8.8 \times 10^4$.

Synthesis Example 2

First, 22.5 g of the compound B and 17.6 g of 2,2'-bipyridyl were charged in a reaction vessel, followed by purging the reaction system with nitrogen gas. Thereto was added 1,500 g of tetrahydrofuran (dehydrated solvent) predeaerated by bubbling with argon gas to provide a mixed solution. To the resultant mixed solution was added 31 g of bis(1,5-cyclooctadiene)nickel (0), which was then stirred at room temperature for 10 minutes and reacted at 60° C. for 3 hours. In this respect, the reaction was conducted in a nitrogen atmosphere.

Next, the resultant reaction solution was cooled, and a 25%-by-mass aqueous ammonia (200 ml)/methanol (900 ml)/ion-exchanged water (900 ml) mixed solution was poured into the solution, which was then stirred for about one hour. The generated precipitate was then collected by filtration, dried under reduced pressure, and dissolved in toluene. The resultant toluene solution was filtered to remove insoluble matter. The toluene solution was then purified by passing through a column packed with alumina.

Then, the purified toluene solution was washed with a 1 N hydrochloric acid aqueous solution, left at rest, and separated, followed by recovering the toluene solution. This toluene solution was washed with about 3%-by-mass aqueous ammonia, left at rest and separated, followed by recovering the toluene solution. The toluene solution was then washed with ion-exchanged water, left at rest and separated, followed by recovering the washed toluene solution.

Subsequently, the washed toluene solution was poured into methanol to generate a precipitate. The precipitate was washed with methanol and then dried under reduced pressure to provide a polymer compound 2. The resultant polymer compound 2 had a weight average molecular weight in polystyrene equivalent of $8.2 \times 10^5$ and a number average molecular weight in polystyrene equivalent of $1.0 \times 10^5$.

Production Example

A photomask for forming an auxiliary electrode was prepared as stated below. From the Fibonacci array (nearest-neighbor distance between lattices: 10 μm) was first extracted such a plurality of unit arrays that they have a mean distance between the lattices of 14 μm and an order of the Fibonacci sequence ranging 500 to 800. Then, lattice points were determined from an array in which the unit arrays were spread all over so that they did not ride over each other; a Voronoi tessellation was performed using the lattice points as generating points. Based on the result of the Voronoi tessellation, a photomask (254 mm×254 mm) was prepared in which a fine line-shaped light-shielding section having a line width of 40 μm was provided on the Voronoi edges of the Voronoi tessellation.

Example

A glass substrate (200 mm×200 mm) was used as a supporting substrate. Cr was deposited in a film thickness of 1,000 nm on the supporting substrate by a DC sputtering method at 120° C. using a Cr target and Ar as a sputtering gas. The film-forming pressure here was 0.5 Pa, and the sputtering power was 2.0 kW. A resist was applied to the Cr film, which was then baked at 110° C. for 90 seconds, exposed to light at an energy of 200 mJ through the photomask obtained in Production Example, developed with a 0.5%-by-mass potassium hydroxide aqueous solution, and postbaked at 130° C. for 110 seconds. The patterning of Cr was performed by immersion in an etching solution for Cr at 40° C. for 120 seconds. Finally, immersion was conducted in a 2%-by-mass potassium hydroxide aqueous solution to strip the resist residue to form an auxiliary electrode composed of Cr.

A first electrode was then formed on the substrate on which the auxiliary electrode was formed. Specifically, an ITO baking target as a material for the first electrode and Ar as a sputtering gas were used to deposit ITO in a film thickness of 3,000 nm by a DC sputtering method at 120° C. The film-forming pressure here was 0.25 Pa, and the sputtering power was 0.25 kW. Annealing treatment was then conducted in an oven at 200° C. for 40 minutes. Subsequently, the substrate on which the first electrode was formed was ultrasonically cleaned using a mildly alkaline detergent at 60° C., cooled water, and warm water at 50° C., pulled out from the warm water for drying, and subjected to $UV/O_3$ cleaning for 20 minutes.

A solution obtained by filtering a suspension of poly(3,4) ethylenedioxythiophene/polystyrene sulfonic acid (from Starck Vitec Co., trade name: Baytron P CH8000) with a filter having a pore diameter of 0.45 μm, followed by further filtration with a filter having a pore diameter of 0.2 μm was formed into a film having a thickness of 80 nm on the cleaned substrate by spin coating, which was then subjected to heat treatment at 200° C. for 15 minutes in an atmosphere of the air to form a hole injection layer (that is, a charge injection layer). The polymer compound 1 and polymer compound 2 obtained in Synthesis Examples 1 and 2 were dissolved in toluene to prepare a 1%-by-mass polymer solution. The prepared solution was formed into a film having a thickness of 80 nm on the substrate on which the hole injection layer was formed by spin coating, which was then subjected to heat treatment at 130° C. for 60 minutes on a hot plate in an atmosphere of nitrogen to form a light-emitting layer. Subsequently, LiF, Ca, and Al were sequentially deposited in thicknesses of 2 nm, 5 nm, and 200 nm, respectively on the substrate on which the light-emitting layer was formed by vacuum deposition to form a second electrode. In this respect, the vapor deposition of metal was started after the degree of vacuum reached $1\times10^{-4}$ Pa or less. Finally, the surface of the second electrode over the substrate over which the second electrode was formed was covered with a glass plate in an inert gas, followed by further coating the four sides of the substrate with a photo-curable resin. The photo-curable resin was then cured to form a protective layer. Thereby, an organic EL device was prepared.

The organic EL device thus obtained is shown in FIG. 5. Specifically, the organic EL device depicted in FIG. 5 comprises supporting substrate 1, auxiliary electrode 2, first electrode 3, charge injection layer 4, light-emitting layer 5, second electrode 6, and protective layer 7. Organic layer 11 composed of the charge injection layer 4 and light-emitting layer 5 is held between the first electrode 3 and the second electrode 6. The auxiliary electrode 2 is formed on the surface of the first electrode 3 opposite the organic layer 11.

<Evaluation of Organic EL Device>

In applying a voltage of 8 volts to the whole organic EL device obtained in Example, when the appearance of the light-emitting surface thereof was visually observed, the light-emitting surface had no variations in light brightness and suffered no occurrence of a coloring phenomenon and Moire fringes during external light reflection. Thus, it was confirmed that the organic electroluminescence device of the present invention can reduce voltage drop due to the resistance of a transparent electrode or a semitransparent electrode to uniformly emit light and can sufficiently suppress the occurrence of coloring and Moire fringes due to interference during external light reflection.

INDUSTRIAL APPLICABILITY

As described above, according to the present invention, an organic electroluminescence device can be provided which can reduce voltage drop due to the resistance of a transparent electrode or a semitransparent electrode to uniformly emit light and can sufficiently suppress the occurrence of coloring and Moire fringes due to interference during external light reflection.

Thus, the organic electroluminescence device of the present invention is useful as a light-emitting device employed in planar light sources, segment display devices, dot-matrix display devices, liquid crystal display devices, and the like.

DESCRIPTION OF REFERENCE NUMERALS

Figure 1:
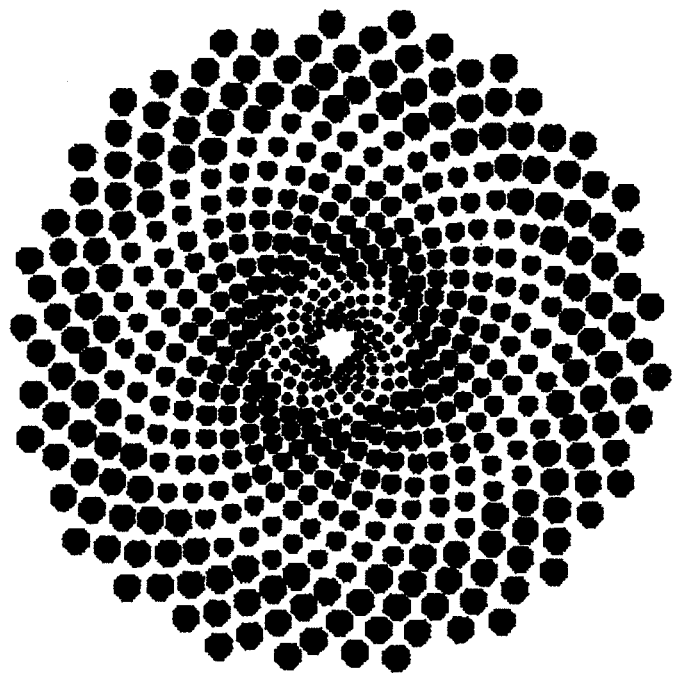
FIG. 1 is a plan view showing the Fibonacci array.
Figure 2:
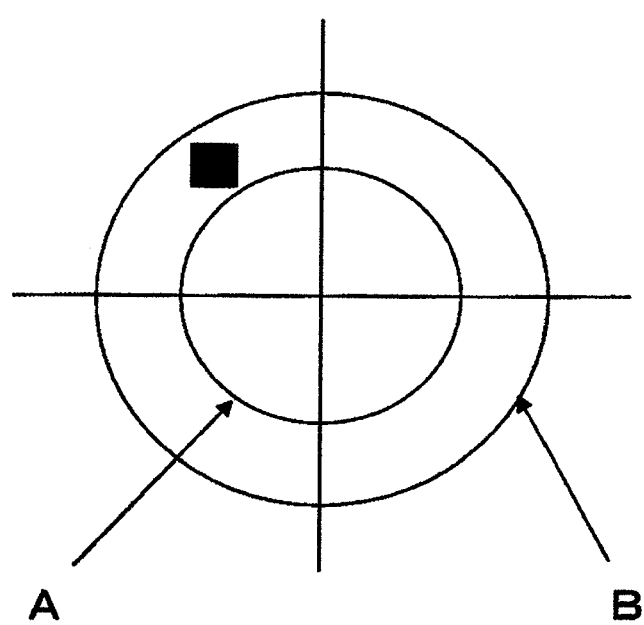
FIG. 2 is a schematic plan view showing one embodiment of a unit array extracted from the Fibonacci array.
Figure 3:
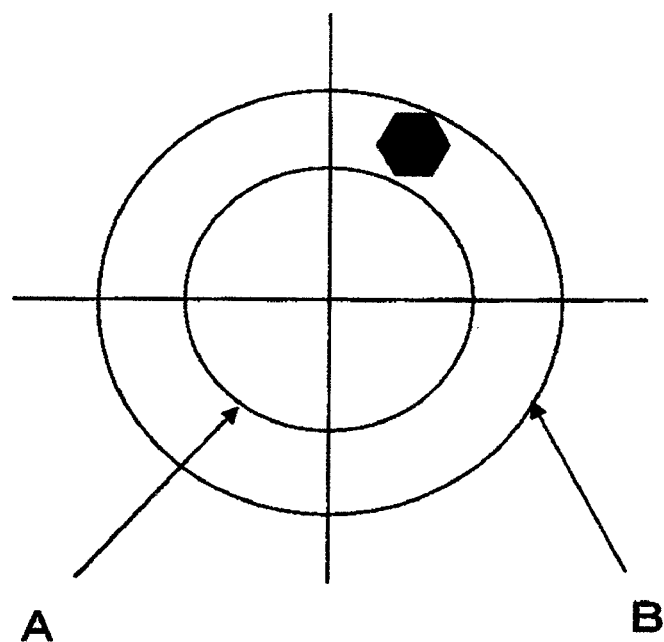
FIG. 3 is a schematic plan view showing another embodiment of a unit array extracted from the Fibonacci array.
Figure 4:
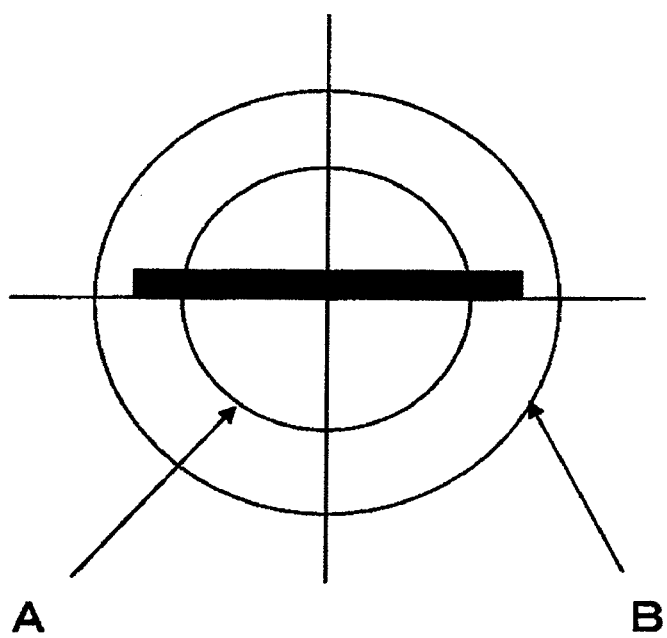
FIG. 4 is a schematic plan view showing another embodiment of a unit array extracted from the Fibonacci array.
Figure 5:
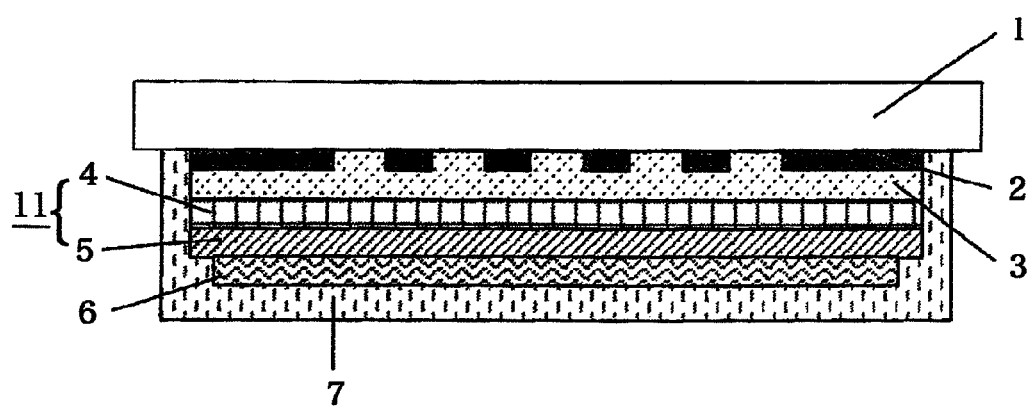
FIG. 5 is a schematic cross-sectional view showing a laminated structure of the organic electroluminescence device obtained in Example.

1 Supporting Substrate
2 Auxiliary Electrode
3 First Electrode
4 Charge Injection Layer
5 Light-Emitting Layer
6 Second Electrode
7 Protective Layer
11 Organic Layer
A A region having an order of the Fibonacci sequence of 300 or less.
B A region having an order of the Fibonacci sequence of 1,000 or less

The invention claimed is:

1. An organic electroluminescence device provided with a first electrode composed of a transparent electrode or a semitransparent electrode, a second electrode facing the first electrode, and at least one organic layer set between the first and second electrodes, characterized in that:
the organic electroluminescence device comprises an auxiliary electrode provided with openings, which is electrically connected to the first electrode and composed of a material having a lower electrical resistance value than that of the first electrode; and
the auxiliary electrode is formed on the surface of the first electrode so as to have the regions defined based on lattice points determined by a quasi-periodic two-dimensional array as the openings;
wherein the auxiliary electrode is formed on Voronoi edges of Voronoi tessellation using the lattice points as generating points so that the Voronoi regions of the Voronoi tessellation are the openings.

2. The organic electroluminescence device according to claim 1, wherein the first electrode is partitioned into a plurality of separate cells, and wherein the plurality of separate cells are electrically connected to each other by the auxiliary electrode.

3. The organic electroluminescence device according to claim 1, wherein the auxiliary electrode is located on a side opposite to the organic layer of surfaces of the first electrode.

4. A planar light source characterized by comprising the organic electroluminescence device according to claim 1.

5. A segment display device characterized by comprising the organic electroluminescence device according to claim 1.

6. A dot-matrix display device characterized by comprising the organic electroluminescence device according to claim 1.

7. A liquid crystal display device characterized by comprising the organic electroluminescence device according to claim 1.

8. An organic electroluminescence device provided with a first electrode composed of a transparent electrode or a semitransparent electrode, a second electrode facing the first electrode, and at least one organic layer set between the first and second electrodes, characterized in that:
the organic electroluminescence device comprises an auxiliary electrode provided with openings, which is electrically connected to the first electrode and composed of a material having a lower electrical resistance value than that of the first electrode; and
the auxiliary electrode is formed on the surface of the first electrode so as to have the regions defined based on lattice points determined by a quasi-periodic two-dimensional array as the openings;
wherein the auxiliary electrode is formed on Delaunay edges of Delaunay triangulation using the lattice points as generating points so that the Delaunay triangular regions of the Delaunay triangulation are the openings.

9. The organic electroluminescence device according to claim 8, wherein the first electrode is partitioned into a plurality of separate cells, and wherein the plurality of separate cells are electrically connected to each other by the auxiliary electrode.

10. The organic electroluminescence device according to claim 8, wherein the auxiliary electrode is located on a side opposite to the organic layer of surfaces of the first electrode.

11. A planar light source characterized by comprising the organic electroluminescence device according to claim 8.

12. A segment display device characterized by comprising the organic electroluminescence device according to claim 8.

13. A dot-matrix display device characterized by comprising the organic electroluminescence device according to claim 8.

14. An organic electroluminescence device provided with a first electrode composed of a transparent electrode or a semi-transparent electrode, a second electrode facing the first electrode, and at least one organic layer set between the first and second electrodes, characterized in that:
   the organic electroluminescence device comprises an auxiliary electrode provided with openings, which is electrically connected to the first electrode and composed of a material having a lower electrical resistance value than that of the first electrode; and
   the auxiliary electrode is formed on the surface of the first electrode so as to have the regions defined based on lattice points determined by a quasi-periodic two-dimensional array as the openings;
   wherein the quasi-periodic two-dimensional array is arranged analogously or similarly to a Fibonacci sequence.

15. A liquid crystal display device characterized by comprising the organic electroluminescence device according to claim 8.

16. The organic electroluminescence device according to claim 14, wherein the first electrode is partitioned into a plurality of separate cells, and wherein the plurality of separate cells are electrically connected to each other by the auxiliary electrode.

17. The organic electroluminescence device according to claim 14, wherein the auxiliary electrode is located on a side opposite to the organic layer of surfaces of the first electrode.

18. A planar light source characterized by comprising the organic electroluminescence device according to claim 14.

19. A segment display device characterized by comprising the organic electroluminescence device according to claim 14.

20. A dot-matrix display device characterized by comprising the organic electroluminescence device according to claim 14.

21. A liquid crystal display device characterized by comprising the organic electroluminescence device according to claim 14.

22. An organic electroluminescence device provided with a first electrode composed of a transparent electrode or a semi-transparent electrode, a second electrode facing the first electrode, and at least one organic layer set between the first and second electrodes, characterized in that:
   the organic electroluminescence device comprises an auxiliary electrode provided with openings, which is electrically connected to the first electrode and composed of a material having a lower electrical resistance value than that of the first electrode; and
   the auxiliary electrode is formed on the surface of the first electrode so as to have the regions defined based on lattice points determined by a quasi-periodic two-dimensional array as the openings;
   wherein the quasi-periodic two-dimensional array has unit arrays extracted from a Fibonacci array so that the lattice points have a mean distance between lattices ranging from 10 to 30 μm and is an array in which the unit arrays are spread all over so that they do not ride over each other.

23. The organic electroluminescence device according to claim 22, wherein the unit arrays are arrays extracted from the Fibonacci array so that the order in the Fibonacci sequence ranges from 300 to 1,000.

24. The organic electroluminescence device according to claim 23, wherein the first electrode is partitioned into a plurality of separate cells, and wherein the plurality of separate cells are electrically connected to each other by the auxiliary electrode.

25. The organic electroluminescence device according to claim 23, wherein the auxiliary electrode is located on a side opposite to the organic layer of surfaces of the first electrode.

26. A planar light source characterized by comprising the organic electroluminescence device according to claim 23.

27. A segment display device characterized by comprising the organic electroluminescence device according to claim 23.

28. A dot-matrix display device characterized by comprising the organic electroluminescence device according to claim 23.

29. A liquid crystal display device characterized by comprising the organic electroluminescence device according to claim 23.

30. The organic electroluminescence device according to claim 22, wherein the first electrode is partitioned into a plurality of separate cells, and wherein the plurality of separate cells are electrically connected to each other by the auxiliary electrode.

31. The organic electroluminescence device according to claim 22, wherein the auxiliary electrode is located on a side opposite to the organic layer of surfaces of the first electrode.

32. A planar light source characterized by comprising the organic electroluminescence device according to claim 22.

33. A segment display device characterized by comprising the organic electroluminescence device according to claim 22.

34. A dot-matrix display device characterized by comprising the organic electroluminescence device according to claim 22.

35. A liquid crystal display device characterized by comprising the organic electroluminescence device according to claim 22.

* * * * *